US008345411B2

(12) United States Patent
Tseng et al.

(10) Patent No.: US 8,345,411 B2
(45) Date of Patent: Jan. 1, 2013

(54) INFORMATION HANDLING SYSTEM SUPPORT MEMBER

(75) Inventors: Ying-Hsien Tseng, Taipei (TW); Wen-Chi Hsu, Jhonghe (TW)

(73) Assignee: Dell Products L.P., Round Rock, TX (US)

( * ) Notice: Subject to any disclaimer, the term of this patent is extended or adjusted under 35 U.S.C. 154(b) by 284 days.

(21) Appl. No.: 12/784,606

(22) Filed: May 21, 2010

(65) Prior Publication Data

US 2011/0286172 A1    Nov. 24, 2011

(51) Int. Cl.
  *G06F 1/16*    (2006.01)
  *H05K 5/00*    (2006.01)
  *H05K 7/00*    (2006.01)

(52) U.S. Cl. .................. 361/679.02; 361/679.6
(58) Field of Classification Search ............. 361/679.01, 361/679.02, 679.31, 679.6; 248/188, 346.03, 248/615; 312/351.1
See application file for complete search history.

(56) References Cited

U.S. PATENT DOCUMENTS

| 3,562,847 | A | * | 2/1971 | Jemison ........................... 16/2.1 |
| 4,718,631 | A | * | 1/1988 | Reynolds et al. ............. 248/615 |
| 4,937,563 | A | * | 6/1990 | Shekita et al. ................ 248/678 |
| 5,388,792 | A | * | 2/1995 | Hastings et al. ........... 248/188.1 |
| 5,887,962 | A | * | 3/1999 | Tsai ........................... 312/351.9 |
| 5,934,774 | A | * | 8/1999 | Wu et al. .................... 312/223.2 |
| 6,024,338 | A | * | 2/2000 | Koike et al. .................... 248/638 |
| 6,311,941 | B1 | * | 11/2001 | Feldmeyer ................. 248/188.8 |
| 6,357,717 | B1 | * | 3/2002 | Kennard, IV ................ 248/638 |
| 6,498,719 | B1 | * | 12/2002 | Bridges .................... 361/679.34 |
| 6,603,656 | B2 | * | 8/2003 | Cho et al. ................. 361/679.02 |
| 6,809,916 | B2 | * | 10/2004 | Nakata et al. ................. 361/115 |
| 6,870,732 | B2 | * | 3/2005 | Huang et al. ............. 361/679.17 |
| 7,095,610 | B1 | * | 8/2006 | Banko ...................... 361/679.55 |
| 7,114,694 | B2 | * | 10/2006 | Li .................................. 248/677 |
| 7,252,350 | B2 | * | 8/2007 | Chen et al. ................. 312/223.2 |
| 7,269,001 | B2 | * | 9/2007 | Huang ..................... 361/679.55 |
| 7,328,880 | B2 | * | 2/2008 | Helot et al. .............. 248/346.01 |
| 7,433,176 | B2 | * | 10/2008 | Kyle et al. ................ 361/679.01 |
| 7,450,373 | B2 | * | 11/2008 | Lee et al. ................. 361/679.55 |
| 7,697,283 | B2 | * | 4/2010 | Mathew et al. .......... 361/679.59 |
| 7,817,418 | B2 | * | 10/2010 | Bailey ...................... 361/679.59 |
| 8,000,092 | B2 | * | 8/2011 | Kim .......................... 361/679.21 |

(Continued)

OTHER PUBLICATIONS

Po-Tien Wang, Iou Ren Su, Tung Yu Chien, Information Handling System Support Member, U.S. Appl. No. 12/552,112, filed Sep. 1, 2009, 26 pages.

*Primary Examiner* — Adrian S Wilson
(74) *Attorney, Agent, or Firm* — Haynes and Boone, LLP

(57) ABSTRACT

A support member includes a plate and an engaging member formed to the plate. The extends laterally and is defined by an upper surface, a lower surface and a rail that extends downward from the lower surface proximate an outer edge of the plate. The engaging member is formed to the lower surface of the plate and around a portion of the rail. The engaging member includes a surface engaging shoulder extending downward from a lower surface of the engaging member and formed around an outer surface of the engaging member. The surface engaging shoulder extends outside of and below the rail. The engaging member includes an upper shoulder formed above the surface engaging shoulder. The engaging member is configured so that the surface engaging shoulder and the upper shoulder flex upward when a force is applied downward to the upper surface of the plate.

20 Claims, 5 Drawing Sheets

U.S. PATENT DOCUMENTS

| | | | |
|---|---|---|---|
| 2003/0081376 A1* | 5/2003 | Helot et al. | 361/683 |
| 2004/0025993 A1* | 2/2004 | Russell | 150/154 |
| 2008/0074831 A1* | 3/2008 | Lee et al. | 361/683 |
| 2009/0231805 A1* | 9/2009 | Schlesener et al. | 361/679.55 |
| 2009/0268398 A1* | 10/2009 | Tang | 361/679.55 |
| 2010/0091441 A1* | 4/2010 | Bailey | 361/679.02 |

* cited by examiner

INFORMATION HANDLING SYSTEM SUPPORT MEMBER

BACKGROUND

The present disclosure relates generally to information handling systems (IHSs), and more particularly to an IHS support member for supporting an IHS chassis.

As the value and use of information continues to increase, individuals and businesses seek additional ways to process and store information. One option is an IHS. An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs typically include an IHS chassis that is commonly placed on a support surface when the IHS is being used. It is desirable for the IHS chassis to sit level with the support surface and not rock and/or wobble when a force is applied to the IHS chassis.

Preventing the rocking and/or wobbling of the IHS chassis, especially on an uneven surface, may be addressed by providing support members or 'feet' that extend from the bottom surface of the IHS chassis to engage the support surface in order to prevent the bottom surface of the IHS chassis from engaging the support surface. One solution includes relatively hard, solid support members fabricated from plastic, metal, or other similar materials. However, this type of solution requires careful control of the distortion tolerances in the IHS chassis that may be introduced during and/or after manufacture of the IHS to ensure that the rocking and/or wobble phenomenon is avoided. Distortion tolerances may arise due to assembly deviations, part bending, weight deviations, and/or any variety of reasons and thus, can raise costs of manufacturing the IHS. Another solution includes relatively soft solid support members fabricated from rubber or other similar material. However, the distortion tolerances discussed above can still result in the rocking and/or wobble phenomenon by preventing all of the support members from engaging the support surface simultaneously. Yet another solution is shown in FIG. 1 and includes a double shoot support member (A) having a rubber outer portion (B), a plastic insert support (C), which includes an integrated plastic attachment heat stake (D) to hold the member (A) to the IHS chassis (E). As should be understood, the plastic insert support (C) that extends outward near the outer edges of the support member (A) causes the support member (A) to have a small deformation capability. However, these traditional support members cannot transform shape enough to absorb system wobble.

Accordingly, it would be desirable to provide an improved IHS support member for supporting an IHS chassis.

SUMMARY

According to one embodiment, a support member includes a plate and an engaging member formed to the plate. The extends laterally and is defined by an upper surface, a lower surface and a rail that extends downward from the lower surface proximate an outer edge of the plate. The engaging member is formed to the lower surface of the plate and around a portion of the rail. The engaging member includes a surface engaging shoulder extending downward from a lower surface of the engaging member and formed around an outer surface of the engaging member. The surface engaging shoulder extends outside of and below the rail. The engaging member includes an upper shoulder formed above the surface engaging shoulder. The engaging member is configured so that the surface engaging shoulder and the upper shoulder flex upward when a force is applied downward to the upper surface of the plate.

DETAILED DESCRIPTION

For purposes of this disclosure, an information handling system (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
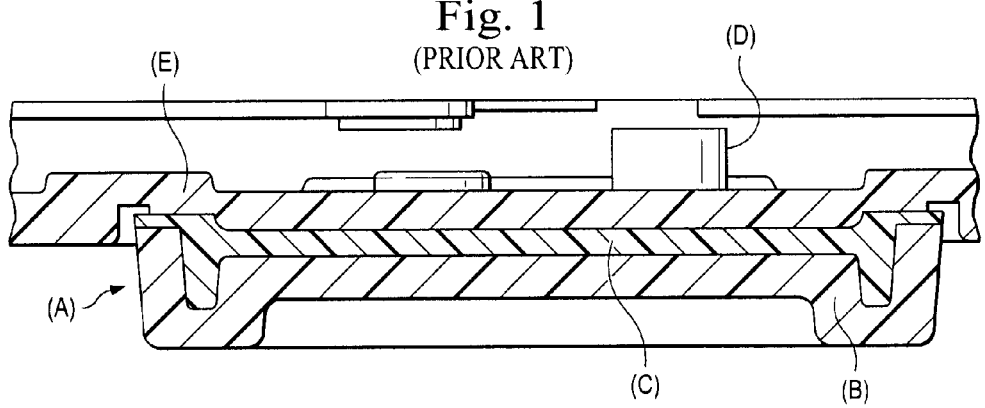
FIG. 1 illustrates a prior art support member.
Figure 2:
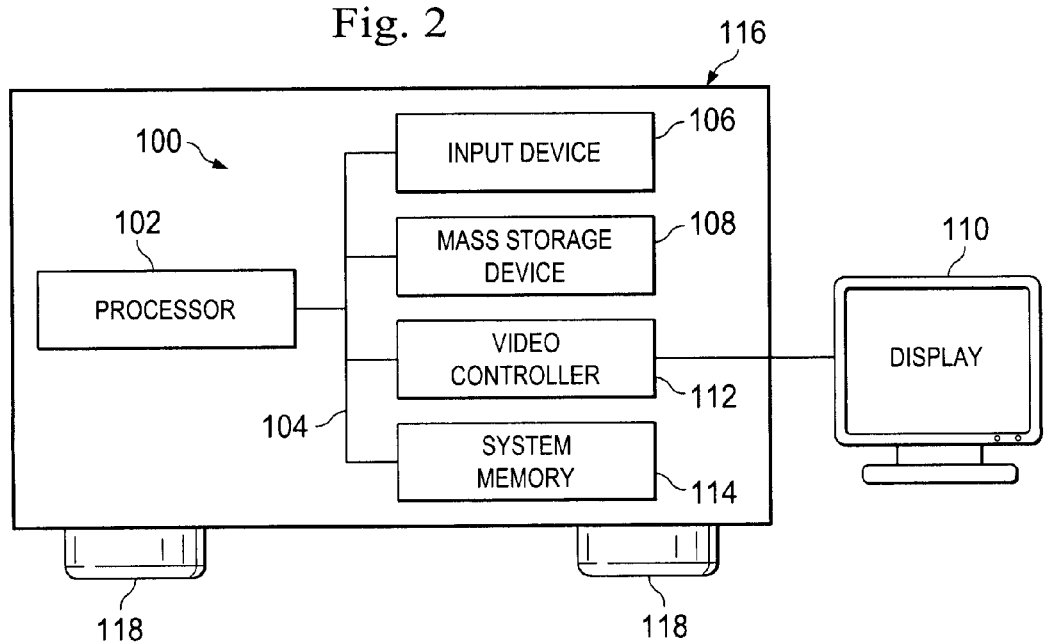
FIG. 2 Illustrates a block diagram of an embodiment of an information handling system (IHS).

FIG. 2 illustrates an embodiment of an IHS 100 including a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. One or more support members (e.g., feet) 118 are coupled to the chassis 116 and situated to support the IHS 100 on a surface. In an embodiment, the present disclosure provides a high flexibility rubber support (e.g., foot) design configured to absorb IHS system wobble. One embodiment includes a portable IHS (e.g., IHS 100) having the front two support members 118 (e.g., support members located on a lower portion of the IHS chassis 116 nearest the user of the IHS 100), wherein the support members 118 are configured as disclosed herein to flex and absorb system wobble when a user applies hands to the IHS keyboard. In an embodiment, the support members 118 are configured to absorb approximately 0.5-0.6 mm more system wobble than previous support member designs, such as that shown in FIG. 1.

Not all IHSs include each of the components shown in FIG. 2, and other components not shown may exist. Furthermore, some components shown as separate may exist in an integrated package or be integrated in a common integrated circuit with other components. Also, a processor (e.g., 102) and a memory I/O hub may be combined together. As can be appreciated, many systems are expandable, and include or can include a variety of components, including redundant or parallel resources. For example, it should be understood that other buses and intermediate circuits can be deployed between the components described above and processor 102 to facilitate interconnection between the components and the processor 102.

Figure 3:
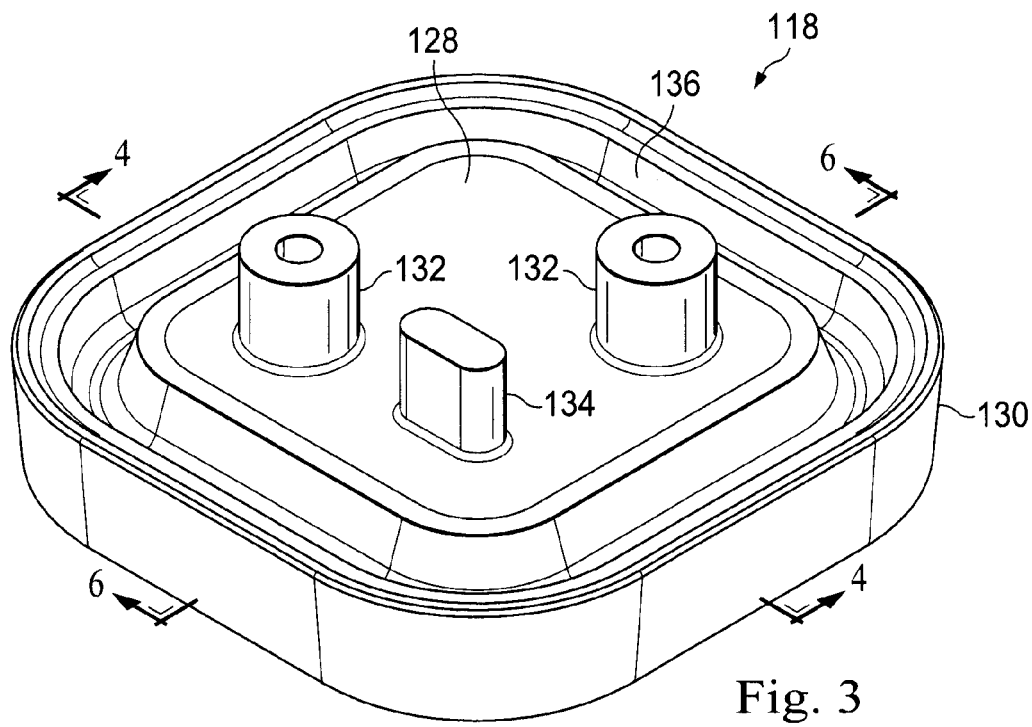
FIG. 3 Illustrates a perspective view of an embodiment of an IHS support member.

FIG. 3 Illustrates a perspective view of an embodiment of the IHS support member 118. The support member 118 includes a semi-ridged (e.g., plastic) frame/support plate 128 and a semi-flexible (e.g., rubber) engaging member 130 formed together, such as in an injection molded double-shoot configuration. In an embodiment, the plate 128 is molded an ABS plastic, such as PC+ABS type C7410 supplied by SABIC in a black color. In an embodiment, the material for the plate 128 includes 0% regrind material and has a flammability rating of VO. However, it should be understood that other semi-ridged materials having other properties may be used for the plate 128. In an embodiment, the engaging member is molded as a rubber material, such as TPU type DP937OAU supplied by BAYER-DESMOPAN. However, it should be understood that other semi-flexible materials having other properties may be used for the engaging member 130.

The plate 128 includes a pair of mounting heat stakes 132 formed from the same material as the plate 128 and extending upward from the plate 128. The heat states 132 are formed to extend into the IHS chassis 116. After passing through mounting apertures in the chassis 116, the heat stakes 132 are heated with a heating element (not shown) to form the heat stake 132 so that it cannot pass back out of the mounting aperture. Thus, the support member 118 is mounted to the chassis 116 and does not fall off of the chassis 116. See also FIG. 7, which is described in more detail below. The plate 128 also includes a locator guide 134 formed from the same material as the plate 128 and extend upward from the plate 128. The locator guide 134 are formed to extend into a locating aperture in the IHS chassis 116 to position the support member 118 as desired on the IHS chassis 116.

The engaging member 130 is formed to include a flex channel 136. The flex channel 136 is formed in an upper portion of the engaging member and extend around the plate 128. The flex channel acts as a hinge-type device for the engaging member 130 allowing the engaging member 130 to utilize the flexible properties of the engaging member 130 to flex and absorb wobble of the IHS chassis 116 as is explained in more detail below.

Figure 4:
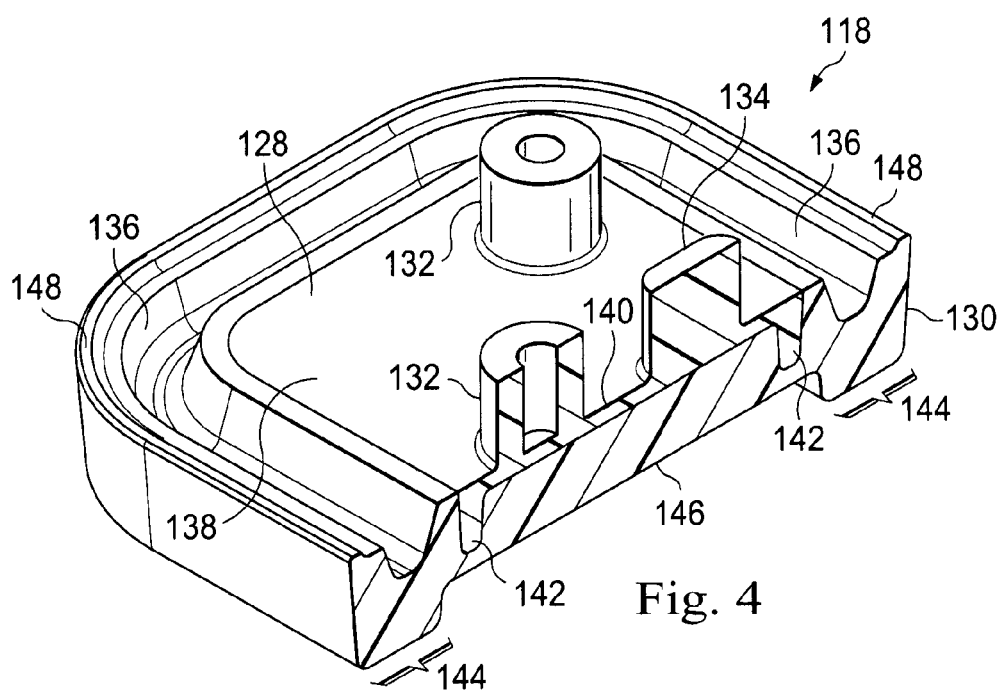
FIG. 4 Illustrates a perspective cut away view along line 4-4 of the IHS support member shown in FIG. 3.

FIG. 4 Illustrates a perspective cut away view along line 4-4 of the IHS support member shown in FIG. 3. FIG. 4 also illustrates how the plate 128 and the engaging member 130 fit together. As can be seen, the plate 128 extends laterally having an upper surface 138 and a lower surface 140. The plate 128 also includes a rail 142 that extends downward from the lower surface 140 of the plate 128 proximate an outer edge of the plate 128. In an embodiment, the rail 142 is an integral part of the plate 128 and molded of the same material and at the same time as the plate 128. The engaging member 130 is formed to the plate lower surface 140 and the rail 142 of the plate 128 using a double shoot molding process, which should be readily understood by those having ordinary skill in the art.

The engaging member 130 is formed having a surface engaging shoulder 144 formed at the lower most point of the support member 118. The surface engaging shoulder 144 extends downward from a lower surface 146 of the engaging member 130 and is formed around an outer surface of the engaging member 130. The surface engaging shoulder 144 extends outside of and below the rail 142. The engaging member 130 also includes an upper shoulder 148 formed above a portion of the surface engaging shoulder 144. The engaging member 130 is formed from a semi-flexible material (e.g., a rubber material) so that the surface engaging shoulder 144 and the upper shoulder 148 flex upward when a force is applied downward to the upper surface of the plate 138. When the IHS chassis 116 includes multiple support members 118 extending down from a lower surface of the chassis 116, the surface engaging shoulder 144 is intended to be the point on which the IHS 100 rests upon a supporting surface (e.g., a desk, table, etc.). As can be seen in the figure, the mounting heat stakes 132 may include a hollow inner surface that allows for easier deformation when contacted by a heat module to deform the stakes 132 for mounting to the chassis 116.

Figure 5:
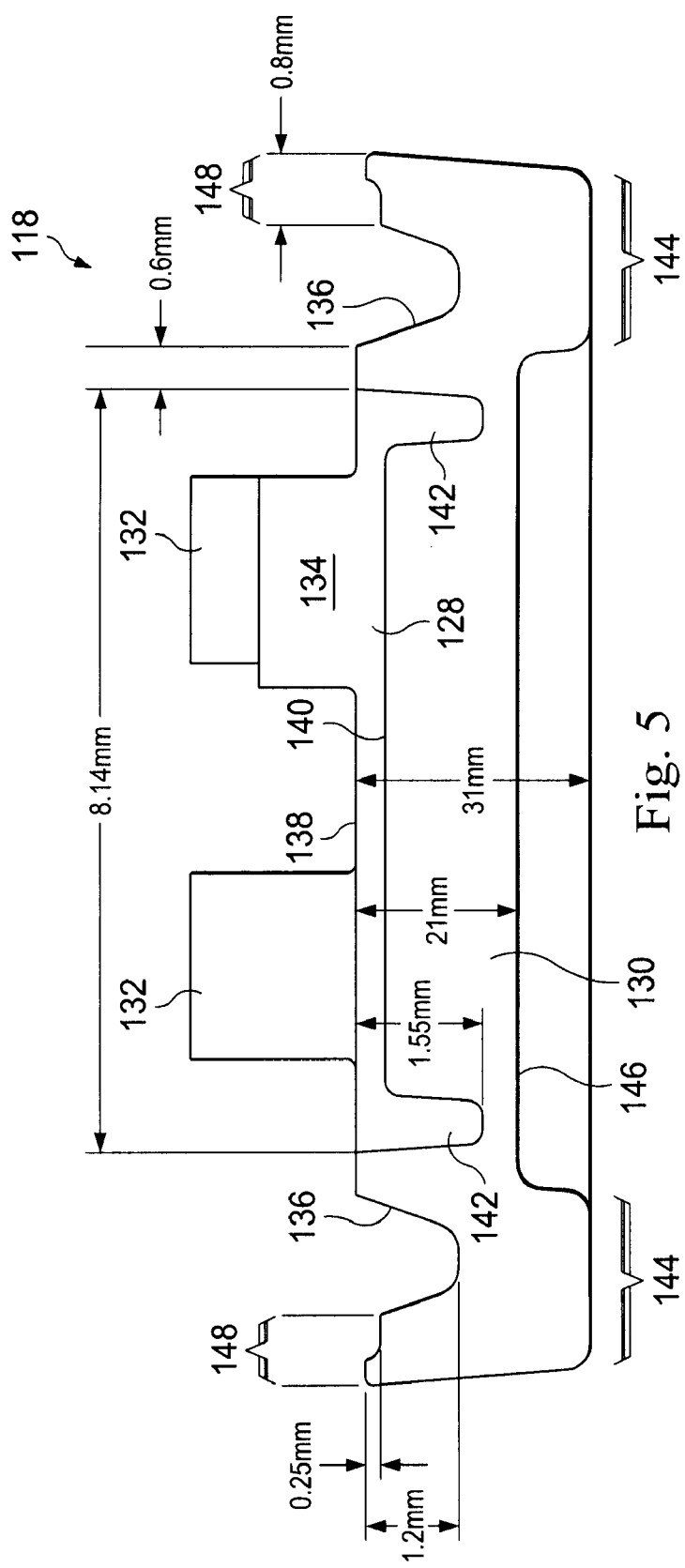
FIG. 5 Illustrates an elevation view along line 4-4 of the IHS support member shown in FIG. 3.

FIG. 5 Illustrates an elevation view along line 4-4 of the IHS support member 118 shown in FIG. 3. Also shown in FIG. 5 is a number of approximate dimensions for an embodiment of the support member 118. For example, in an embodiment, the plate 128 is formed to extend laterally approximately 8.14 mm rail-to-rail and the flex channel 136 is formed to be approximately 1.2 mm deep. Other dimensions are provided for reference to enable one of ordinary skill in the art to understand how the flex channel 136, along with the plate 128 being a semi-ridged material and the engaging member 130 being a semi-flexible material, enables the surface engaging shoulder 144 and the upper shoulder 148 flex upward when pressure is applied downward to the upper surface 138 of the plate 128. Accordingly, as should be understood, when multiple support members 118 are affixed to a lower portion of the IHS chassis 116, unevenness of the support surface and/or unevenness of the lower portion of the IHS chassis 116 (e.g., due to manufacturing tolerances), may be absorbed by the flexible support members 118 to reduce or eliminate IHS wobble. It should be understood that the support member 118 may be formed using other dimensions and/or other proportions among the dimensions so long as the surface engaging shoulder 144 is allowed to flex upward along the flex channel 136.

Figure 6:
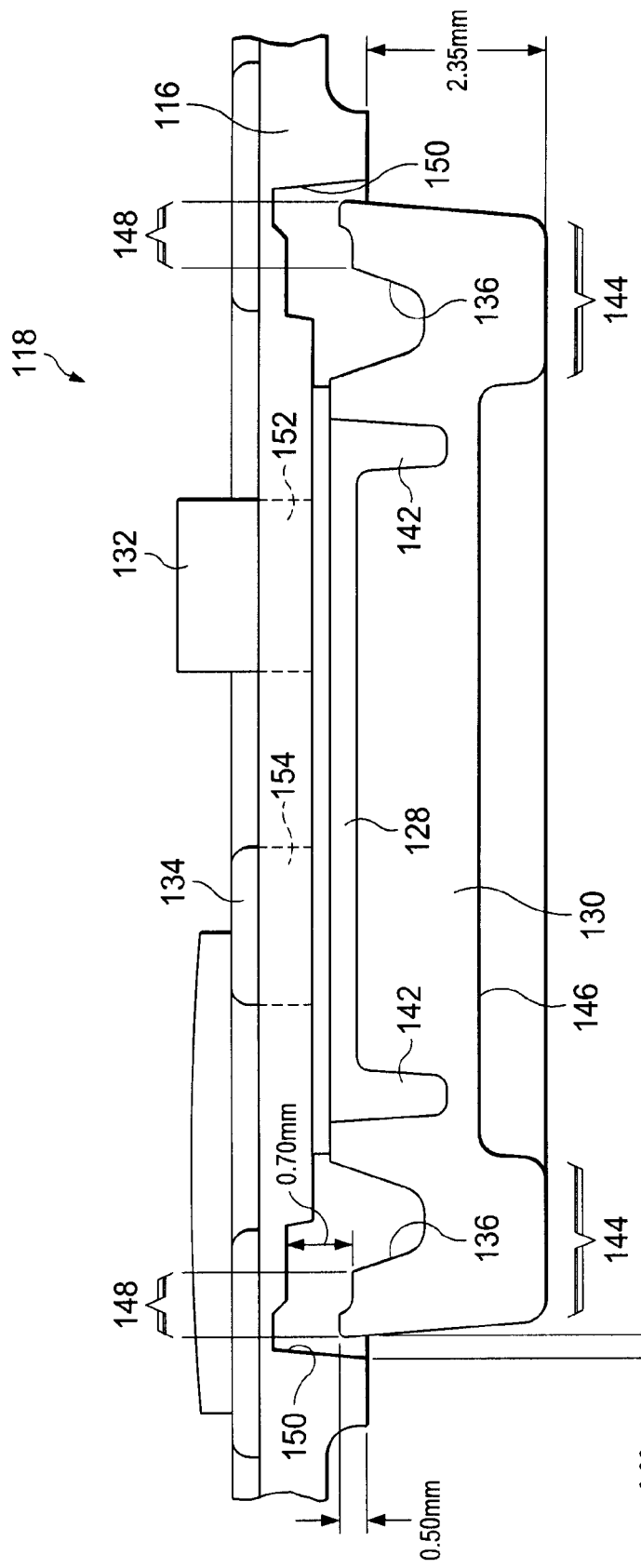
FIG. 6 Illustrates an elevation view along line 6-6 of the IHS support member shown in FIG. 3 at rest while engaging an IHS chassis.

FIG. 6 Illustrates an elevation view along line 6-6 of the IHS support member 118 shown in FIG. 3 at rest while engaging the IHS chassis 116. In other words, this is shown with the IHS 100 not resting on a support surface using the support members 118. As shown, the chassis 116 includes a receiving trough 150 along a lower surface of the chassis 116 and extending upward from a bottom surface of the chassis 116 to mate with and receive the upper shoulder 148 of the support member 118 as the surface engaging shoulder 144 and the upper shoulder 148 flex upward to the chassis 116 (see also FIG. 7 described below). As the mounting heat stakes 132 are located through chassis mounting apertures 152 and the locator guide 134 is located through chassis locating aperture 154, the support member 118 is located so that the upper shoulder 148 flexes into the receiving trough 150. The IHS chassis 116 may be configured without the receiving trough 150 so long as there is room above the upper shoulder 148 for the surface engaging shoulder 144 and the upper shoulder 148 to flex upward to absorb chassis wobble. In an embodiment a mounting washer 156 is located between the plate upper surface 138 and the chassis 116. In an embodiment, the mounting washer 156 is formed from a plastic material. It should be understood that the IHS chassis 116 may be configured with or without the mounting washer 156.

Figure 7:
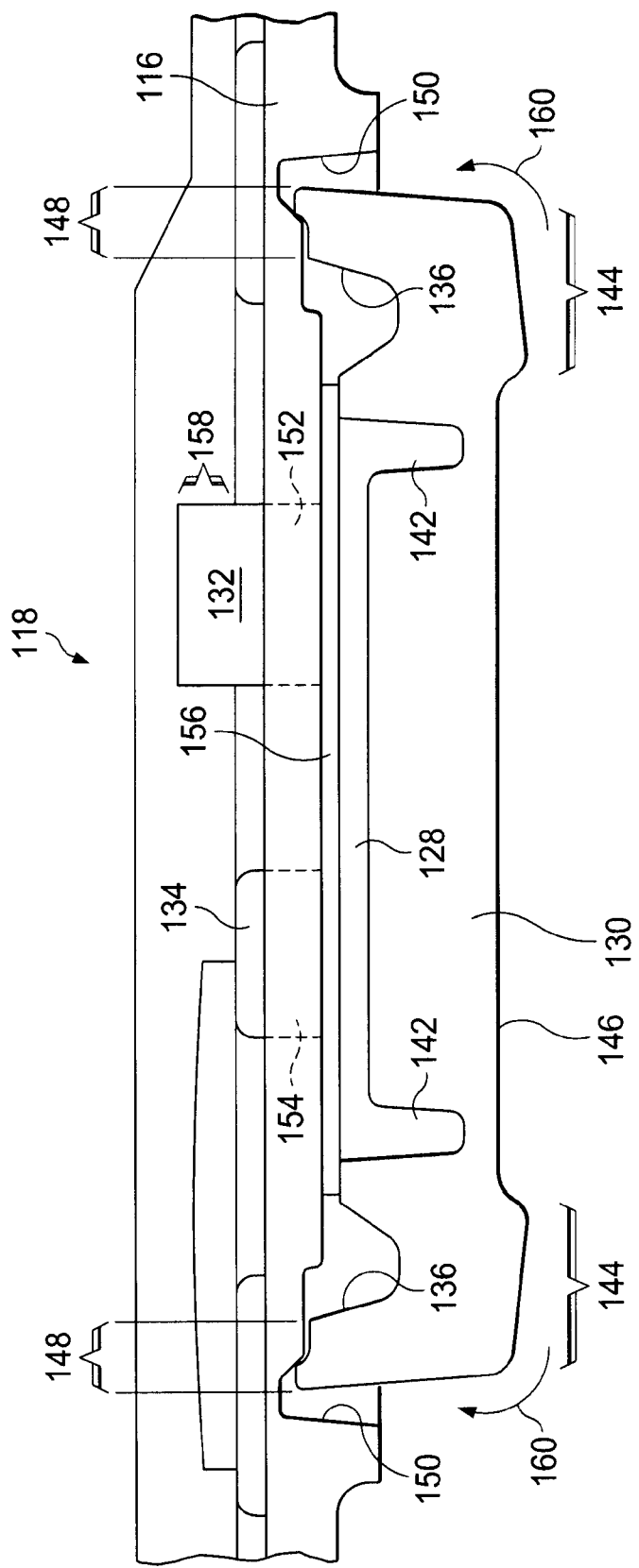
FIG. 7 Illustrates an elevation view along line 6-6 of the IHS support member shown in FIG. 3 flexed while engaging an IHS chassis.

FIG. 7 Illustrates an elevation view along line 6-6 of the IHS support member 118 shown in FIG. 3 flexed while engaging the IHS chassis 116. FIG. 7 also illustrates an embodiment of the heat stake 132 in a deformed state 158. The heat stake 132 is a molded part integrated with the plate 128 formed using a thermal plastic. As such, the heat stake 132 deforms when engaged by a heating element device that is above a threshold temperature for deforming the material used for the heat stake 132. The heating element used to deform the stake 132 causes the stake 132 to expand after so that it can not pass back through the mounting aperture 152. In other words, deforming the heat stake 132 after it passes through the mounting aperture 152 in the chassis 116 holds the support member 118 to the chassis 116.

FIG. 7 also shows the surface engaging shoulder 144 and the upper shoulder 148 flexed upward in direction 160. As should be understood, pressure applied downward on the upper surface 138 of the plate 128 (e.g., when the IHS 100 is setting on a support surface), causes the engaging member 130 to flex at the flex channel 136 around the engaging member 130. Each support member 118 may flex a different amount depending on downward pressure, levelness of support surface, flatness of the chassis 116, flexibility of the engaging member 130, and/or a variety of other circumstances as should be understood. Such flexing allows for the support member 118 to be flexed at a first distance below the bottom surface of the chassis 116 for one support member and at a different distance below the bottom surface of the chassis 116 for another support member. Accordingly, tolerances may be absorbed by the different flexing values to absorb IHS wobble.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A support member comprising:
   a plate including an upper surface, a lower surface located opposite the upper surface, and a rail that extends from the lower surface about a perimeter of the plate;
   an engaging member extending from the lower surface of the plate and around a portion of the rail;
   a surface engaging shoulder extending from the engaging member and about a perimeter of the engaging member, wherein the surface engaging shoulder is located outside of the perimeter of the plate that includes the rail;
   an upper shoulder located above the surface engaging shoulder; and
   a flex channel defined by the engaging member between the plate and the upper shoulder, wherein the flex channel is configured so that the surface engaging shoulder and the upper shoulder flex upward such that the upper shoulder extends past the upper surface of the plate when the plate is coupled to a chassis that defines a receiving trough adjacent the plate and a force is applied towards the upper surface of the plate.

2. The support member of claim 1, wherein the surface engaging shoulder defines a channel that is bounded by the surface engaging shoulder, is located spaced apart from and adjacent to the plate, and is positioned substantially within the perimeter of the plate that includes the rail.

3. The support member of claim 1, wherein the plate includes one or more mounting heat stakes extending upward from the plate and configured to deform when heat is applied to the heat stake.

4. The support member of claim 1, wherein the plate comprises an ABS plastic material and the engaging member comprises a rubber material.

5. The support member of claim 1, wherein the flex channel is dimensioned to provide a hinge-type device for the surface engaging shoulder and the upper shoulder relative to the rest of the engaging member.

6. The support member of claim 1, wherein the plate includes a locator guide extending upward from the plate.

7. The support member of claim 1, wherein the plate and the engaging member comprise a double shoot molded device.

8. An information handling system (IHS) comprising:
   a chassis including a plurality of support member couplings and defining a receiving trough adjacent each of the plurality of support member couplings;
   a processor;
   a memory device coupled to the processor, wherein the chassis-memory device and the processor are located in the chassis; and
   a support member coupled to each of the plurality of support member couplings on the chassis, each of the support members including:
      a plate including an upper surface, a lower surface located opposite the upper surface, and a rail that extends from the lower surface about a perimeter of the plate;
      a coupling feature extending from the upper surface of the plate and into engagement with the support member coupling on the chassis;
      an engaging member extending from the lower surface of the plate and around a portion of the rail;
      a surface engaging shoulder extending from the engaging member and about a perimeter of the engaging member, wherein the surface engaging shoulder is located outside of the perimeter of the plate that includes the rail;

an upper shoulder located above the surface engaging shoulder; and a flex channel defined by the engaging member between the plate and the upper shoulder, wherein the flex channel is configured so that the upper shoulder extends into the receiving trough adjacent the support member coupling on the chassis when a force is applied towards the upper surface of the plate.

9. The IHS of claim 8, wherein the surface engaging shoulder defines a channel that is bounded by the surface engaging shoulder, is located spaced apart from and adjacent to the plate, and is positioned substantially within the perimeter of the plate that includes the rail.

10. The IHS of claim 8, wherein the coupling feature includes one or more mounting heat stakes extending upward from the plate and configured to deform when heat is applied to the heat stake.

11. The IHS of claim 8, wherein the plate comprises an ABS plastic material and the engaging member comprises a rubber material.

12. The IHS of claim 8, wherein the flex channel is dimensioned to provide a hinge type device for the upper shoulder relative to the rest of the engaging member.

13. The IHS of claim 8, wherein the plate includes a locator guide extending upward from the plate.

14. The IHS of claim 8, wherein the plate and the engaging member comprise a double shoot molded device.

15. A method of supporting an information handling system (IHS), the method comprising:
providing a chassis that houses a processor and a memory device that is coupled to the processor, wherein a plurality of support members are coupled to the chassis such that each of the support members is located adjacent a respective receiving trough defined by the chassis, and wherein each support member includes:
a plate including an upper surface, a lower surface located opposite the upper surface, and a rail that extends from the lower surface about a perimeter of the plate;
an engaging member extending from the lower surface of the plate and around a portion of the rail;
a surface engaging shoulder extending from the engaging member and about a perimeter of the engaging member, wherein the surface engaging shoulder is located outside of the perimeter of the plate that includes the rail;
an upper shoulder located above the surface engaging shoulder; and
a flex channel defined by the engaging member between the plate and the upper shoulder;
placing the chassis on a support surface such that the chassis is supported by the support members and the surface engaging shoulder and the upper shoulder on at least one support member flex such that the upper shoulder extends into the receiving trough.

16. The method of claim 15, wherein the surface engaging shoulder defines a channel that is bounded by the surface engaging shoulder, is located spaced apart from and adjacent to the plate, and is positioned substantially within the perimeter of the plate that includes the rail.

17. The method of claim 15, wherein the plate includes one or more heat stakes and the method further comprises:
extending the one or more heat stakes through one or more mounting apertures in the chassis; and
deforming the one or more heat stakes using heat so that the one or more heat stakes cannot pass back through the one or more mounting apertures.

18. The method of claim 15, further comprising:
molding the support members as a double shoot device, wherein the plate is molded using an ABS plastic material and the engaging member is molded using a rubber material.

19. The method of claim 15, wherein the flex channel is dimensioned to provide a hinge-type device for the surface engaging shoulder and the upper shoulder relative to the rest of the engaging member.

20. The method of claim 15, further comprising:
locating the support members on the chassis using a locator guide extending upward from the plate.

* * * * *